(12) United States Patent
Matsubara et al.

(10) Patent No.: US 6,465,273 B1
(45) Date of Patent: Oct. 15, 2002

(54) METHOD OF MAKING ZNSE BASED LIGHT EMITTING DEVICE WITH IN LAYER USING VIBRATION AND PRESSURE

(75) Inventors: Hideki Matsubara; Koji Katayama; Akihiko Saegusa, all of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/564,194

(22) Filed: May 4, 2000

(30) Foreign Application Priority Data

May 13, 1999 (JP) .......................... 11-132924
Apr. 13, 2000 (JP) ....................... 2000-112012

(51) Int. Cl.[7] .............................................. H01L 21/00
(52) U.S. Cl. ...................... 438/84; 438/102; 438/603; 438/615
(58) Field of Search .................. 438/84, 102, 603, 438/120, 118, 612, 615; 257/626; 362/800

(56) References Cited

U.S. PATENT DOCUMENTS

| | | | | |
|---|---|---|---|---|
| 4,347,655 A | * | 9/1982 | Zory et al. ................... 29/589 |
| 5,221,984 A | * | 6/1993 | Furuyama et al. .......... 359/154 |
| 5,226,053 A | * | 7/1993 | Cho et al. .................... 372/45 |
| 5,660,461 A | * | 8/1997 | Ignatius et al. ............. 362/241 |
| 5,962,133 A | * | 10/1999 | Yamaguchi et al. ........ 428/403 |
| 6,204,094 B1 | * | 3/2001 | Hotchkiss et al. .......... 438/120 |
| 6,206,962 B1 | * | 3/2001 | Kijima et al. ............... 117/108 |

FOREIGN PATENT DOCUMENTS

| | | |
|---|---|---|
| JP | 3161981 | 7/1991 |
| JP | 6-5920 | 1/1994 |

OTHER PUBLICATIONS

Nakanshi, F et al.; Low–threshold room–temperature CW operation of ZnSe–based blue/green laser diodes grown on conductive ZnSe substrates; Electronic Letters, vol. 34, Issue 5, Mar. 5, 1998; pp. 496–497.*

* cited by examiner

*Primary Examiner*—Long Pham
*Assistant Examiner*—Fernando Toledo
(74) *Attorney, Agent, or Firm*—W. F. Fasse; W. G. Fasse

(57) ABSTRACT

A light emitting device includes an LED chip fixed to an electrode body via a conductive layer of In or an In alloy. The conductive layer is in ohmic-contact with an n-type ZnSe crystal substrate of the LED chip. To make the device, In or an In alloy is melted on the electrode body, the ZnSe substrate is placed directly on the melted In or In alloy and then subjected to at least one of vibration and pressure to achieve a good bond and ohmic contact between the In or In alloy and the ZnSe substrate.

14 Claims, 3 Drawing Sheets

US 6,465,273 B1

METHOD OF MAKING ZNSE BASED LIGHT EMITTING DEVICE WITH IN LAYER USING VIBRATION AND PRESSURE

BACKGROUND OF THE INVENTION

1. Field of the Invention

The present invention relates generally to light emitting devices with a light emitting diode (LED) and methods of manufacturing the same and in particular to light emitting devices with a low-cost, high-performance ZnSe homoepitaxial LED and methods of manufacturing the same.

2. Description of the Background Art

Conventionally, AlGaAs and GaAsP for red color, GaP for yellow-green color, AlGaInP for orange and yellow colors, and the like have been used as materials for LEDs of high luminance. Such LEDs are formed on a conductive substrate.

FIG. 4A shows a light emitting device 1a having the LED as described above. As shown in the figure, light emitting device 1a includes resin 2, an LED chip 3a, lead frames 4a and 4b, and a wire 5.

FIG. 4B is an enlarged view of a region 6 shown in FIG. 4A. As shown in the figure, LED chip 3a is connected to lead frame 4a via silver paste 18. LED chip 3a includes a conductive substrate 7a, an epitaxial, light emitting layer 8a causing an emission, a first electrode 10a, and a second electrode 17. The first electrode 10a is connected to lead frame 4b via wire 5.

The LED thus configured is provided by an established, mass-production process at low cost and one such LED is produced at as low a cost as ten yen or therebelow.

However, an LED based on GaInN, a material for blue and green colors and furthermore for white color, is configured as shown in FIGS. 5A and 5B, since it uses as its substrate an insulating sapphire substrate.

More specifically, as shown in FIGS. 5A and 5B, an LED chip 3b has first and second electrodes 10a and 17a on an outermost surface of an epitaxial, light emitting layer 8b. The second electrode 17a is provided in a concave portion formed on a surface of epitaxial light emitting layer 8b. The second electrode 17a is connected to lead frame 4a via a wire 5b and the first electrode 10a is connected to lead frame 4b via a wire 5a. An insulating substrate 7b is fixed to lead frame 4a with silver paste 18 posed therebetween.

Because of the complicated structure as described above, a light emitting device having a GaInN-based LED requires a high manufacturing cost and its unit price is several times greater than the aforementioned low-cost product.

A ZnSe-based material is promising as a material for an LED for blue and green colors and white color. The present inventors have worked on developing an LED having a ZnSe-based homoepitaxial structure employing an n-type ZnSe substrate which is conductive and also transparent in the visible range. Such structure is different from a GaInN-based structure in that it has a conductive substrate. As such, it may have the low-cost LED structure as shown in FIGS. 3A and 3B and theoretically an LED can be manufactured at low cost.

However, it has been found that forming an ohmic electrode on an n-type ZnSe substrate having low carrier concentration requires a special technique. More specifically, for an n-type ZnSe substrate having a carrier concentration of no less than $3\times10^{18}$ cm$^{-3}$, an ohmic electrode can be readily provided by normally depositing and then thermally annealing with Ti, Al or a similar material. It has been found that for an n-type ZnSe substrate having a carrier concentration less than $3\times10^{18}$ cm$^{-3}$, however, an ohmic electrode cannot be readily provided by the combination of normal deposition and thermal anneal.

It has also been found that silver (Ag) readily diffuses into a ZnSe crystal and thus readily causes a defect referred to as non-luminescent center. In other words, using silver paste to fix a ZnSe crystal may degrade an LED containing the ZnSe crystal.

SUMMARY OF THE INVENTION

The present invention has been made to overcome such disadvantages as above and it contemplates providing an ohmic electrode on an n-type ZnSe substrate having low carrier concentration, and preventing an LED from the degradation as described above.

In accordance with the present invention a light emitting device includes an n-type ZnSe substrate, an electrode base, and a conductive layer. The conductive layer is formed of In or an In alloy and it fixes the n-type ZnSe substrate and the electrode base and also serves as an ohmic electrode for the n-type ZnSe substrate. The electrode base is only required to be formed of conductive material, such as a lead frame or an electrode provided on an insulating substrate.

The present inventors have studied materials for fixing an n-type ZnSe substrate and an electrode base and have found that a conductive layer of In or In alloy may be used as a material for fixing the n-type ZnSe substrate and the electrode base to obtain ohmic contact if the substrate has a carrier concentration of as low as less than $3\times10^{18}$ cm$^{-3}$. Furthermore, unlike silver, In or the In alloy does not diffuse easily into a ZnSe crystal to cause a defect referred to as non-luminiscent center. As such, an LED can be prevented from degrading due to such diffusion.

In the present invention a light emitting device preferably includes a ZnSe homoepitaxial light emitting diode. Such light emitting diode has on an n-type ZnSe substrate an epitaxial light emitting layer of ZnSe-related compounds.

The present invention is particularly useful for a light emitting device including a ZnSe homoepitaxial light emitting diode capable of emitting blue and green lights and also white light.

The n-type ZnSe substrate has a carrier concentration preferably of at least $3\times10^{17}$cm$^{-3}$ and less than $3\times10^{18}$ cm$^{-3}$.

A conductive layer of In or In alloy allows an ohmic electrode to be provided for carrier concentrations as low as above.

In the present invention a light emitting diode preferably operates on a voltage of no more than 3V. Accordingly, it is useful for a backlight of an LCD (Liquid Crystal Display) incorporated for example in a mobile phone.

In the present invention a light emitting device may be manufactured by a method including the following steps: an epitaxial light emitting layer is provided on an n-type ZnSe substrate. In or an In alloy is melted on an electrode base. Directly on the melted In or In alloy the n-type ZnSe substrate is mounted and subjected to at least one of vibration and pressure. Thereafter it is thermally annealed.

In and the In alloy have a melting point as low as 155° C. or therebelow and In and the like have a superior wettability with respect to metal and also solidify at room temperature. As such, In and the like can be used as a conductive adhesive or so-called solder. The present inventors have studied whether In and the like can be used for adhering the n-type ZnSe substrate and the electrode base together and found that using the technique characteristic to the invention as described above allows In and the like to be used as a conductive adhesive in accordance with the present invention. More specifically, by mounting the n-type ZnSe substrate directly on melted In or the like and subjecting it to at least one of vibration and pressure the In or the like can diffuse into the ZnSe crystal substrate for a temperature as low as approximately 200° C., and thereafter by thermally annealing the same an eutectic alloy can be produced and ohmic contact can be obtained for the ZnSe substrate of low carrier concentration.

The vibrant applied is preferably ultrasonic vibration. The pressure applied is preferably at least 0.544 MPa ($5.56 \times 10^{-2}$ kg/mm$^2$) and less than 109 MPa (11.1 kg/mm$^2$).

The vibration applied may be a scrubbing operation caused by a mechanical vibration having a frequency of at least 1 Hz and at most 1000 Hz. In this instance, a pressure of at least 0.217 MPa ($2.22 \times 10^{-2}$ kg/mm$^2$) and less than 109 MPa (11.1 kg/mm$^2$) is applied simultaneously with the vibration.

If vibration and pressure are applied simultaneously, preferably the frequency is at least 10 Hz and at most 300Hz and the pressure is at least 0.217 MPa ($2.22 \times 10^{-2}$ kg/mm$^2$) and at most 10.9 MPa (1.11 kg/mm$^2$). More preferably, the frequency is at least 10 Hz and at most 60 Hz and the pressure is at least 0.217 MPa ($2.22 \times 10^{-2}$ kg/mm$^2$) and at most 5.45 MPa (0.555 kg/mm$^2$).

By applying such vibration and/or pressure to the n-type ZnSe substrate, ohmic contact can be obtained, as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
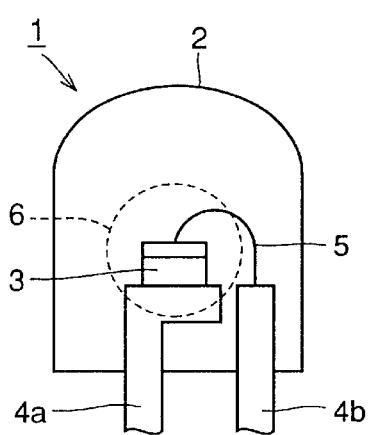
FIG. 1A is a side view of a light emitting device in the present invention and FIG. 1B is a cross section enlarging a region 6 shown in FIG. 1A.
Figure 1B:
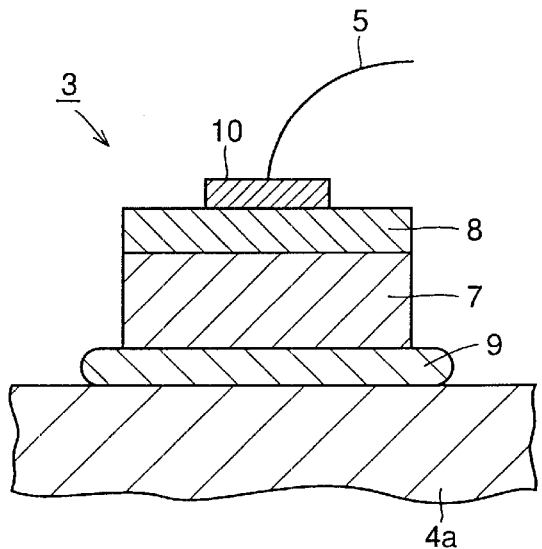

The embodiments of the present invention will now be described with reference to FIGS. 1A to 3B. FIG. 1A is a side view of a light emitting device 1 with a ZnSe-based homoepitaxial LED in accordance with the present invention. FIG. 1B is a cross section enlarging a region 6 shown in FIG. 1A.

Figure 3A:
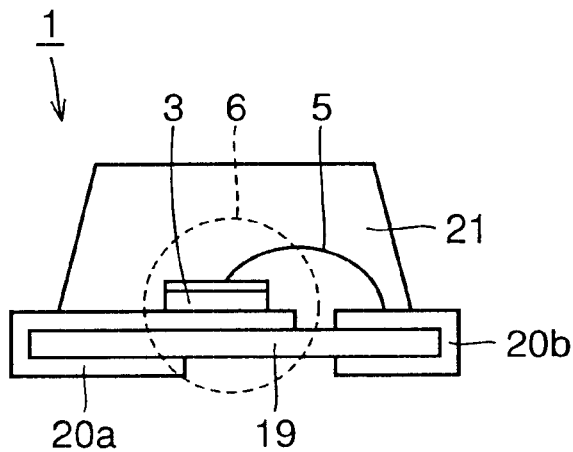
FIG. 3A is a side view of a variation of the FIG. 1A light emitting device and FIG. 3B is a cross section enlarging a region 6 shown in FIG. 3A.
Figure 3B:
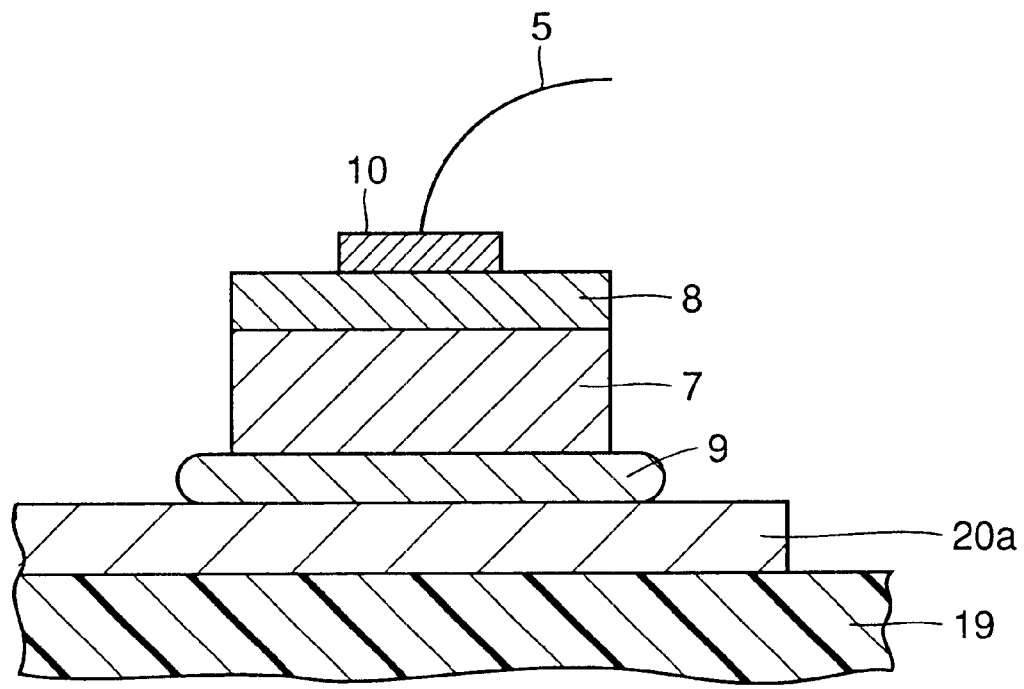

As shown in FIGS. 1A and 1B, light emitting device 1 of the present invention is similar in shape to a light emitting device 1a including a LED chip 3a capable of being mass-produced at low cost as shown in FIGS. 3A and 3B. As such, it may be mass-produced at low cost.

As shown in FIGS. 1A and 1B, LED chip 3 of the present invention includes an n-type ZnSe crystal substrate 7 and an epitaxial light emitting layer 8 and it is fixed to a lead frame 4a via a conductive layer 9 of In or In alloy. The rest of its configuration is the same as shown in FIGS. 3A and 3B and will thus not be described.

Figure 4A:
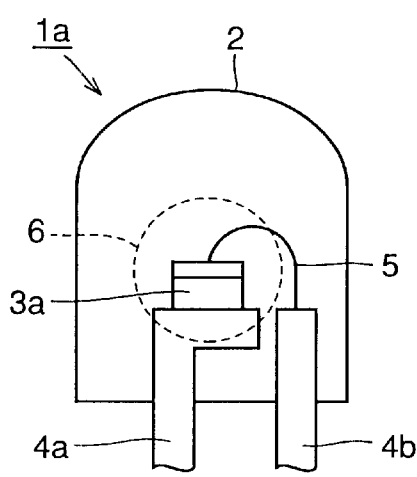
FIG. 4A is a side view of a light emitting device having a normal LED and FIG. 4B is a cross section enlarging a region 6 shown in FIG. 4A.
Figure 4B:
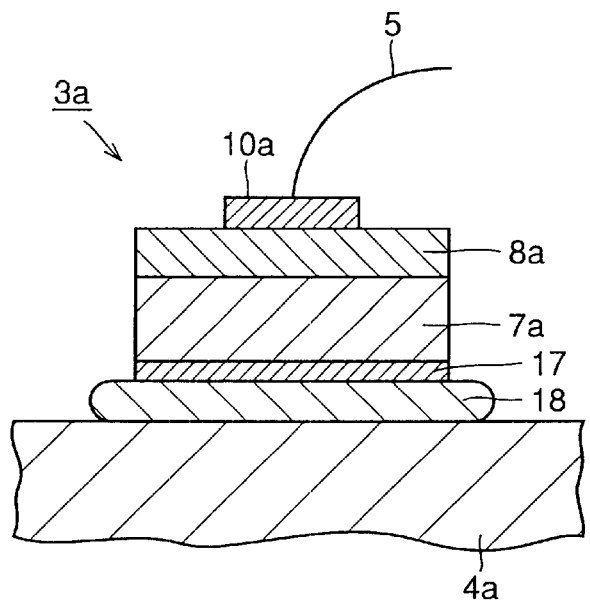
Figure 5A:
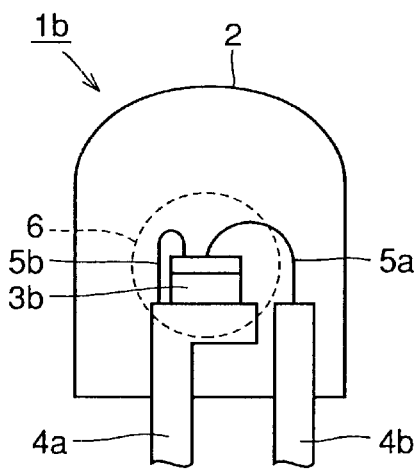
FIG. 5A is a side view of a light emitting device with a GaN-based LED and FIG. 5B is a cross section enlarging a region 6 shown in FIG. 5A.
Figure 5B:
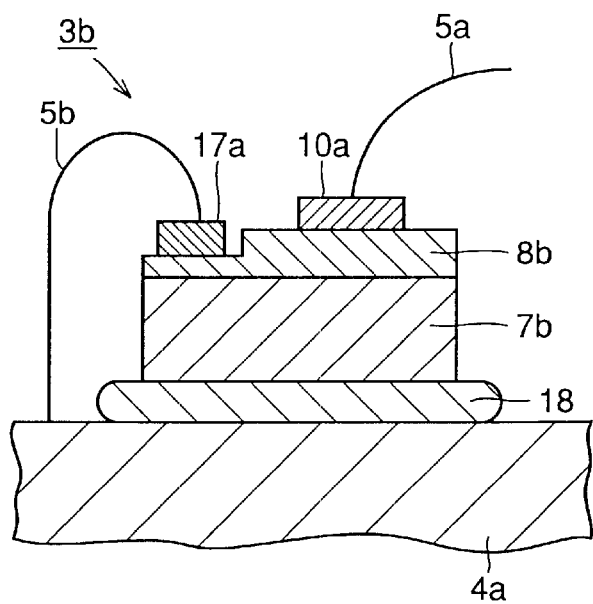

The FIG. 1B conductive layer 9 is in ohmic-contact with n-type ZnSe crystal substrate 7 and also adheres n-type ZnSe crystal substrate 7 and lead frame 4a together. Providing conductive layer 9 eliminates the necessity of providing a second electrode 17 of FIGS. 4A and 4B on a back surface of n-type ZnSe crystal substrate 7.

Light emitting device 1 configured as above is manufactured in a method as described below: initially, as a conductive n-type ZnSe substrate, a substrate is prepared having a carrier concentration of at least $3 \times 10^{17}$ cm$^{-3}$ and less than $3 \times 10^{18}$ cm$^{-3}$. On the substrate, a blue light emitting structure as shown in FIG. 2, having a light emitting peak wavelength of 485 nm, is homoepitaxially grown with molecular beam epitaxy (MBE).

Figure 2:
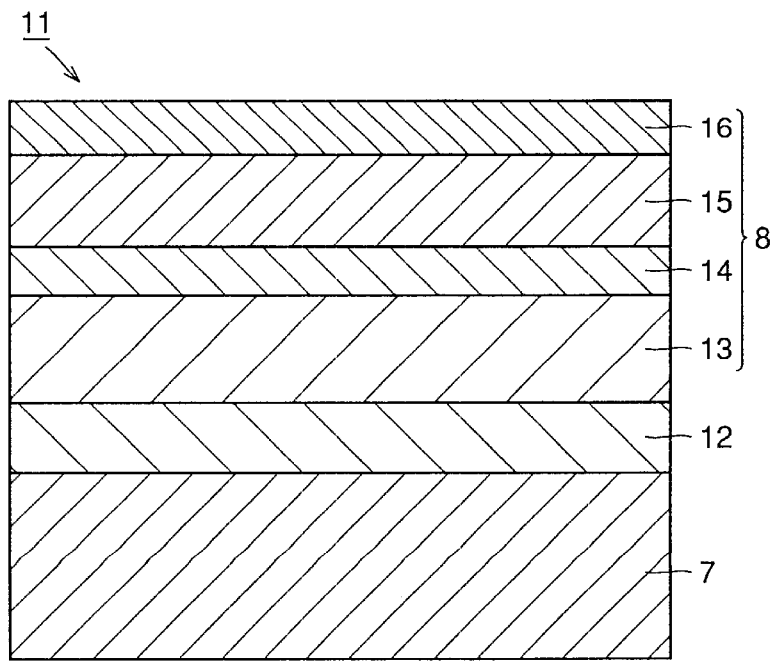
FIG. 2 is a cross section of a ZnSe homoepitaxial wafer in the present invention.

As shown in FIG. 2, epitaxial light emitting layer 8 has a p-type contact layer 16 having a multilayer superlattice structure of p-type doped ZnTe and ZnSe, a p-type clad layer 15 of a p-type doped $Zn_{0.85}Mg_{0.15}S_{0.10}Se_{0.90}$ layer, a quantum well active layer 14 having a multilayer structure of a ZnSe layer and a $Zn_{0.88}Cd_{0.12}Se$ layer, and an n-type clad layer 13 of an n-type doped $Zn_{0.85}Mg_{0.15}S_{0.10}Se_{0.90}$ layer. Epitaxial light emitting layer 8 is provided on n-type ZnSe crystal substrate 7 with an n-type ZnSe buffer layer 12 posed therebetween.

After a ZnSe homoepitaxial wafer 11 is fabricated as above, on the wafer's contact layer 16 there are provided a dotted patterned p-type electrode of Ti/Au and also an Au electrode in the form of a thin film and covering the entire surface and having a thickness no more than 20 nm. After these electrodes are provided, LED chip 3 of 300 $\mu$m×300 $\mu$m is cut off wafer 11.

Then, a thin piece of pure In is placed on lead frame 4a and lead frame 4a is heated to 180° C. to melt the In. Directly thereon, LED chip 3 is mounted. Furthermore, with the In melted, ultrasonic vibration is applied to LED chip 3 from the upper side thereof. Thus, the In can be appropriately diffused in n-type ZnSe crystal substrate 7.

Then, wire bonding is provided to provide a wire 5 formed of gold or the like and connecting electrode 10 and lead frame 4b together. With such connection achieved, a thermal treatment is provided in a nitrogen ambient at a temperature of approximately 250° C. Thus, an eutectic alloy can be produced between conductive layer (In) 9 and n-type ZnSe crystal substrate 7 and conductive layer 9 can thus be in ohmic-contact with n-type ZnSe crystal substrate 7. Then, resin-molding is provided to form resin 2. Thus, light emitting device 1 as shown in FIGS. 1A and 1B is provided.

In order to check how much level of carrier concentration n-type ZnSe crystal substrate 7 should have for conductive layer 9 for example of In to achieve ohmic contact therewith, through the above process the present inventors actually fabricated four light emitting devices 1 as described below: more specifically, there were fabricated light emitting devices 1 having incorporated therein LED chip 3 having four types of n-type ZnSe crystal substrates 7 having carrier concentrations of $1 \times 10^{17}$/cm$^3$, $3 \times 10^{17}$/cm$^3$, $5 \times 10^{17}$/cm$^3$, $1 \times 10^{18}$/cm$^3$, respectively. Then, with a current of 20 mA injection, the LEDs were measured for operating voltage. The results are as shown in Table 1:

TABLE 1

| Carrier Concentration of Substrate | $1 \times 10^{17}/cm^3$ | $3 \times 10^{17}/cm^3$ | $5 \times 10^{17}/cm^3$ | $1 \times 10^{18}/cm^3$ |
|---|---|---|---|---|
| LED Operating Voltage (20 mA) | 7.5 V | 2.9 V | 2.7 V | 2.7 V |

As is apparent from Table 1, when n-type ZnSe crystal substrate 7 has a carrier concentration of at least $3 \times 10^{17}/cm^{-3}$, the corresponding LED operating voltage is sufficiently low (no more than 3V). In other words, it has been found that rather than providing an electrode through deposition on a back surface of ZnSe crystal substrate 7, bringing n-type ZnSe crystal substrate 7 into direct contact with the above melted In can provide ohmic contact. It has also been confirmed that the present devices all reliably operate at room temperature and conductive layer 9 for example of In also sufficiently serves as an adhesive for LED chip 3. Since silver paste was not used, the device did not degrade rapidly.

Furthermore, a similar experiment was conducted for an In-Sn alloy (Sn: 10%) and exactly the same result was obtained. Thus, In alloy may also be available. Such In alloy is preferably an alloy based on In, including In of at least 50%.

Then, the present inventors conducted the following experiment to confirm whether any technique other than the above ultrasonic vibration can be used to obtain ohmic contact.

As a conductive n-type ZnSe substrate, a substrate of $5 \times 10^{17}/cm^3$ in carrier concentration was prepared and epitaxially grown and processed to provide a device, as in the previous example, to produce LED chip 3 of 300 μm×300 μm. Then, as in the previous example, In is similarly melted on lead frame 4a and thereon n-type ZnSe crystal substrate 7 is mounted.

In this condition, LED chip 3 was subjected to downward loads of 2 g, 5 g, 10 g, 50 g, 100 g, 500 g, 1 kg. LED chip 3 with the load of 1 kg applied had its edge damaged. As such, the rest of the six types of LED chip 3 were wire-bonded, thermally annealed in nitrogen ambient at 250° C., and then finally resin-molded.

The six types of light emitting devices 1 thus fabricated were subjected to a 20 mA injection and their LEDs were thus measured for operating voltage. The results were as provided in Table 2.

TABLE 2

| Load Applied When LED Chip 3 Mounted | 2 g | 5 g | 10 g | 50 g | 100 g | 500 g |
|---|---|---|---|---|---|---|
| Operating Voltage (20 mA) | 6.5 V | 3.0 V | 2.8 V | 2.7 V | 2.7 V | 2.7 V |

As is apparent from Table 2, when LED chip 3 is mounted and a load of no less than 5g (a pressure applied of at least 0.544 MPa: $5.56 \times 10^{-2}$ kg/mm$^2$) is applied thereto, the corresponding operating voltage is sufficiently low (no more than 3V). Thus it has been found that if the substrate is brought into direct contact with melted In, as described above, simply applying a load rather than applying only ultrasonic vibration can provide ohmic contact.

It should be noted that LED chip 3 may receive any large levels of load that do not damage the same. As such it is believed that any loads less than 1 kg may be applied thereto. More specifically, it is believed that any pressures less than 109 MPa (11.1 kg/mm$^2$) may be applied to LED chip 3.

The present devices also all reliably operate at room temperature and In also sufficiently serves as an adhesive for LED chip 3. Furthermore, a similar experiment was conducted with LED chip 3 of 500 μm×500 μm and substantially the same result was obtained.

Furthermore, the present inventors conducted the following experiment to confirm whether a mechanical vibration of a frequency other than ultrasonic wave and pressure can be combined to obtain ohmic contact.

As described above, ZnSe crystal substrate 7 of $5 \times 10^{17}/cm^3$ in carrier concentration was used to provide LED chip 3 of 300 μm×300 μm. Then, as described previously, In was similarly melted on lead frame 4a and thereon LED chip 3 is mounted.

In this condition, LED chip 3 received loads of 1 g, 2 g, 5 g, 10 g, 50 g, 100 g, 500 g downwards and were simultaneously subjected to mechanical vibrations of 1 Hz, 10 Hz, 60 Hz, 300 Hz, 1000 Hz, 2000 Hz, 58 kHz (ultrasonic vibrations). Furthermore, LED chip 3 was wire-bonded, thermally annealed in nitrogen ambient at 250 ° C., and then finally resin-molded.

49 light emitting devices 1 thus fabricated were subjected to a 20 mA conduction and thus measured for operating voltage. The results were as shown in Table 3.

TABLE 3

<Operating Voltage for Various Loads and Vibrations>

|  | 1 g | 2 g | 5 g | 10 g | 50 g | 100 g | 500 g |
|---|---|---|---|---|---|---|---|
| 1 Hz | 3.9 V | 2.8 V | 2.8 V | 2.7 V | 2.8 V | 2.7 V | 2.7 V |
| 10 Hz | 3.6 V | 2.9 V | 2.7 V | 2.7 V | 2.7 V | 2.7 V | 2.8 V |
| 60 Hz | 3.6 V | 2.8 V | 2.7 V | 2.7 V | 2.8 V | 2.7 V | 2.7 V |
| 300 Hz | 3.8 V | 2.7 V | 2.7 V | 2.7 V | 2.7 V | 2.8 V | 2.7 V |
| 1000 Hz | 3.4 V | 2.7 V | 2.8 V | 2.7 V | 2.7 V | 2.7 V | 2.9 V |
| 2000 Hz | 3.2 V | 2.7 V | 2.7 V | 2.7 V | 2.8 V | 2.8 V | 2.7 V |
| 58 kHz | 2.9 V | 2.7 V | 2.7 V | 2.7 V | 2.7 V | 2.9 V | 2.8 V |

As is apparent from Table 3, if mechanical vibration and load are applied simultaneously, any vibrating frequency and any load of no less than 2 g (a pressure applied of at least 0.217 MPa: $2.22 \times 10^{-2}$ kg/mm$^2$) result in a sufficiently low operating voltage (no more than 3V) and ohmic contact can be obtained.

More specifically, a scrubbing operation caused by the mechanical vibration as above can break a natural oxide film formed on a surface of In, and In and ZnSe crystal substrate 7 can be satisfactorily connected together. This may be considered a factor allowing ohmic contact, as described above.

It should be noted that it has also been confirmed that for a vibration of less than 1 Hz in frequency also, ohmic contact can be obtained if such vibration is applied for a sufficient period of time (at least 10 seconds, for example). This technique is, however, not suitable for mass production of LEDs, since the working time for fabricating the LEDs is increased.

Then, exactly the same experiment was conducted for a large number of LEDs, with vibration and load simultaneously applied, to check a failure rate for example of cracked chips. In this experiment, a fixed load of 10 g was applied while the vibration applied was varied in frequency from 1 Hz, 10 Hz, 60 Hz, 300 Hz, 1000 Hz, 2000 Hz and 58 kHz (ultrasonic vibration) to count a failure rate for example of cracked chips. The results are shown in Table 4.

TABLE 4

<Failure Rate for Different Vibrating Frequencies>

| Vibrating Frequency | 1 Hz | 10 Hz | 60 Hz | 300 Hz | 1000 Hz | 2000 Hz | 58 kHz |
|---|---|---|---|---|---|---|---|
| Failure Rate | 1% | 0% | 2% | 1% | 1% | 8% | 13% |

As is apparent from Table 4, when the frequency applied exceeds 2000 Hz, the corresponding failure rate increases. It should be noted that this result does not mean that mechanical and ultrasonic vibrations of 2000 Hz or above are not suitable as a technique for obtaining ohmic contact, although it indicates that combining a mechanical vibration (a so-called scrubbing operation) in a range of 1 Hz to 1000 Hz with a load as appropriate is preferable for mass-producing LEDs with high yield.

A more preferable frequency caused by mechanical vibration is at least 10 Hz and at most 300 Hz and a more preferable load is at least 2 g and at most 100 g (corresponding to a pressure applied of at least 10.9 MPa: 1.11 kg/mm$^{-2}$). A still more preferable frequency is at least 10 Hz and at most 60 Hz and a still more preferable load is at least 2 g and at most 50 g (corresponding to a pressure applied of at least 5.45 MPa: 5.55 kg/mm$^2$). LED chip 3 is generally damaged to a lesser degree as the load applied thereto is reduced as described above.

Reference will now be made to FIGS. 3A and 3B to describe a variation of light emitting device 1 shown in FIGS. 1A and 1B.

While in the above embodiments LED chip 3 is mounted on lead frame 4a, it can be mounted on any conductive members or layers. More specifically, it may be mounted for example on an electrode pattern of a substrate (a printed circuit board).

As shown in FIGS. 3A and 3B, light emitting device 1 as the present variation is so-called surface-mounted and it includes LED chip 3, an insulating substrate 19 of insulating material, patterned electrodes 20a and 20b provided on insulating substrate 19, and transparent resin 21.

Insulating substrate 19 may for example be a glass epoxy substrate using highly heat-resistive resin (for example, BT resin) or a thin-plate substrate using ceramic superior in heat conduction (for example, AlN). Patterned electrodes 20a and 20b may have an Au/Ni/Cu structure for the glass epoxy substrate and an Au/Ni/W structure for the ceramic substrate.

On patterned electrode 20a, LED chip 3 is fixed with conductive layer 9 of In or In alloy posed therebetween. It is fixed in the same manner as when it is fixed to a lead frame. Then it is wire-bonded and resin-molded (preferably, resin-shielded employing transfer-molding) to complete light emitting device 1 as shown in FIG. 3A.

The FIG. 3A light emitting device 1 is also significantly suitable for mass production and such device of a chip type can be obtained at low cost. It should be noted while in the FIG. 3A light emitting device 1 only a single LED chip 3 is mounted on insulating substrate 19, multiple LED chips 3 may be mounted on insulating substrate 19.

As has been described above, in accordance with the present invention, for an n-type ZnSe of less than 3×10$^8$ cm$^{-3}$ in carrier concentration and thus incapable of obtaining ohmic contact through normal deposition, ohmic contact can be achieved, and it is also not necessary to use Ag considered to degrade the device characteristics through diffusion. As a result, there can be obtained a light emitting device having high luminescence, operating on low voltage and also preventing its components from rapidly degrading.

Since at a temperature no less than the melting point of In or a similar metal an n-type ZnSe substrate may be subjected to a pressure of a predetermined value and a vibration of a predetermined value, light emitting devices can be mass-produced in a process close to a normal low-cost process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a light emitting device, comprising the steps of:

providing a light emitting layer and an electrode on an n-type ZnSe substrate having a carrier concentration of at least 3×10$^{17}$ cm$^{-3}$ and less than 3×10$^{18}$ cm$^{-3}$;

melting In or an In alloy into a melted state on an electrode base;

placing said n-type ZnSe substrate directly on said In or In alloy in said melted state and applying at least one of vibration and pressure to said substrate; and performing a thermal treatment after the step of applying at least one of said vibration and said pressure.

2. The method of claim 1, wherein said vibration is ultrasonic vibration.

3. The method of claim 1, wherein said pressure is at least 0.544 MPa and less than 109 MPa.

4. The method of claim 1, wherein:

said vibration includes a scrubbing operation provided by a mechanical vibration of at least 1 Hz and at most 1000 Hz in frequency;

said pressure is at least 0.217 MPa and less than 109 MPa; and said vibration and said pressure are applied simultaneously.

5. The method of claim 4, wherein:

said frequency is at least 10 Hz and at most 300 Hz; and said pressure is at least 0.217 MPa and at most 10.9 MPa.

6. The method of claim 4, wherein:

said frequency is at least 10 Hz and at most 60 Hz; and said pressure is at least 0.217 MPa and at most 5.45 MPa.

7. The method of claim 1, wherein said thermal treatment is performed at a temperature of 250° C.

8. The method of claim 1, wherein said steps together result in said light emitting device having an operating voltage between said electrode and said electrode base of not more than 3 volts with an injected current of 20 mA.

9. A method of assembling a light emitting device comprising the steps:

a) providing a light emitting diode including an n-type ZnSe substrate having a carrier concentration of at least $3\times10^{17}$ cm$^{-3}$ and less than $3\times10^{18}$ cm$^{-3}$, and a light emitting layer on said substrate;

b) melting an In-based material containing at least 50% of In into a melted state at a first temperature on an electrode member;

c) placing said substrate of said light emitting diode directly into contact with said In-based material in said melted state on said electrode member, and applying at least one of vibration and pressure between said substrate and said electrode member relative to each other; and d) after said step c), heat treating said substrate and said In-based material at a heat treating temperature greater than said first temperature.

10. The method according to claim 9, wherein said In-based material is In.

11. The method according to claim 9, wherein said heat treating temperature is in a range from 200° C. to 250° C.

12. The method according to claim 9, wherein said step c) comprises applying both said vibration and said pressure simultaneously.

13. The method according to claim 9, wherein said step c) comprises applying only said vibration without said pressure.

14. The method according to claim 9, wherein said step c) comprises applying only said pressure without said vibration, and said pressure is at least 0.544 MPa and less than 109 MPA.

* * * * *